United States Patent [19]

Sempel

[11] 4,453,090
[45] Jun. 5, 1984

[54] MOS FIELD-EFFECT CAPACITOR

[75] Inventor: Adrianus Sempel, Eindhoven, Netherlands

[73] Assignee: U.S. Philips Corporation, New York, N.Y.

[21] Appl. No.: 272,459

[22] Filed: Jun. 11, 1981

[30] Foreign Application Priority Data

Jul. 4, 1980 [NL] Netherlands ......................... 8003874

[51] Int. Cl.³ ...................... H01L 27/08; H01L 29/78
[52] U.S. Cl. .................................. 307/303; 307/304; 357/42; 357/23.6
[58] Field of Search ............... 307/303, 304, 577, 578, 307/584, 313, 324, 320; 357/42, 51, 23.6

[56] References Cited

U.S. PATENT DOCUMENTS

| 3,285,074 | 11/1966 | Elazar | 307/318 X |
| 3,407,339 | 10/1968 | Booher | 307/577 X |
| 3,983,414 | 9/1976 | Stafford et al. | 307/578 |
| 4,167,018 | 9/1979 | Ohba et al. | 357/42 X |
| 4,198,580 | 4/1980 | Culmer | 307/577 |
| 4,384,300 | 5/1983 | Iizuka | 357/42 |

OTHER PUBLICATIONS

Cirovic, "Basic Electronics: Devices, Circuits, and Systems", Reston Publishing Company, Va., pp. 113-114, 1974.

Primary Examiner—Larry N. Anagnos
Assistant Examiner—David R. Bertelson
Attorney, Agent, or Firm—Robert T. Mayer; Steven R. Biren

[57] ABSTRACT

A field-effect capacitance includes a first region of a first conductivity type in a semiconductor layer, which region is provided with at least one contact electrode connected to a first terminal and with an insulated electrode arranged on said region and connected to a second terminal. A second semiconductor region of a second conductivity type opposite to the first conductivity type is formed in the semiconductor layer, which second region is provided with at least one contact electrode coupled to the first terminal, and with an insulated electrode arranged on said second region and connected to the second terminal. The two capacitances thus formed are then alternately operative for alternate polarities of the signal voltage. The resulting capacitance structure is suitable for high signal voltage applications, and provides a smooth transition when alternate signal polarities are applied.

6 Claims, 3 Drawing Figures

MOS FIELD-EFFECT CAPACITOR

BACKGROUND OF THE INVENTION

The invention relates to a field-effect capacitance with a first region of a first conductivity type (P−) in a semiconductor layer, which region is provided with at least one contact electrode, which is connected to a first terminal, and which region is provided with an insulated electrode arranged on said region, which electrode is connected to a second terminal.

Such a field-effect capacitance is generally constituted by a field-effect transistor with short-circuited source and drain electrodes, use being made of the gate-source capacitance. However, it is found that such a capacitance is less suitable for high signal voltage applications.

SUMMARY OF THE INVENTION

It is the object of the invention to provide a field-effect capacitance of the above type which is capable of being used in high signal voltage applications and to this end the invention is characterized in that in the semiconductor layer there is provided a second semiconductor region of a second conductivity type (N) opposite to the first conductivity type (P−), which second region is provided with at least one contact electrode, which is connected to the first terminal, and with an insulated electrode arranged on said second region, which electrode is connected to the second terminal. In the case of a field-effect capacitance of the type mentioned above the capacitance is found to disappear at a signal voltage of a specific polarity because the conductive layer (the "channel") underneath the insulated electrode disappears. The addition in accordance with the invention ensures that if the conductive layer underneath one insulated electrode disappears, such a layer is formed underneath the other insulated electrode, so that a capacitance always exists between the first and the second terminal.

In a field-effect capacitance in accordance with the invention, whose semiconductor properties are such that at a voltage of zero volts between the contact electrode and the insulated electrode of each of the said regions no conductive layer is formed which extends completely underneath the associated insulated electrode (enhancement type), it may be advantageous that between the contact electrode of the first region and the contact electrode of the second region there is included a bias voltage source, which bias-voltage source has such a value that underneath one of the two insulated electrodes there is always a conductive layer which extends completely underneath the electrode.

This step ensures a smooth transition between the capacitance underneath the one insulated electrode smoothly and a capacitance underneath the other insulated electrode.

This embodiment may be further characterized in that the bias-voltage source is constituted by the series connection of a first ($T_3$) and a second ($T_4$) insulated-gate field-effect transistor, which first and second field-effect transistors may be formed in portions of the regions corresponding to the first and the second region respectively, the drain electrodes of the first and second field-effect transistors being connected to the associated gate electrodes.

This ensures that the voltage across the bias-voltage source, in a process-independent manner, corresponds to the bias voltage required for a smooth transition from the capacitance underneath the one insulated electrode to the capacitance underneath the other insulated electrode.

The embodiment is additionally characterized in that the bias-voltage source is shunted by a field-effect capacitance.

Because of this the bias-voltage source resistance, if any, is short-circuited for signals, the additional field-effect capacitance being always correctly biased by the bias-voltage source.

With respect to the use of field-effect transistors, the field-effect capacitance in accordance with the invention may further be characterized in that the first and the second region adjoin each other and that the insulated electrodes arranged on said regions also adjoin each other.

This feature yields an area reduction, which may be of great importance when incorporating the capacitances in an integrated circuit.

BRIEF DESCRIPTION OF THE DRAWING

The invention will now be described in greater detail with reference to the drawing, in which.

DESCRIPTION OF THE PREFERRED EMBODIMENTS

Figure 1:
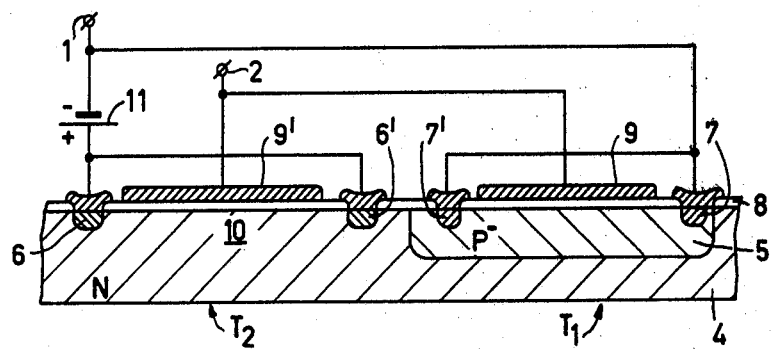
FIG. 1 represents a field-effect capacitance in accordance with the invention.

The field-effect capacitance of FIG. 1 comprises a semiconductor body 4, in the present example of an N-type semiconductor material containing a P−-type region 5, in which contacts 7 and 7' are formed by means of n+ diffusions. On the region 5 an insulating layer 8, for example silicon oxide, is disposed, through which metallic contact is made with the contact diffusions 7 and 7', while in the present example metallic contact is also made between the diffusion 7 and the diffusion 5 in order to make the potential of the diffusion 5 nonfloating. An electrode 9 is arranged on the insulating layer 8. Such a configuration is that of an n-channel field-effect transistor ($T_1$). In order to use this configuration as a capacitance the elecrode 9 is connected to a terminal 2 and the contact diffusions 7 and 7' (source and drain electrodes in the field-effect transistor) to a terminal 1. It is alternatively possible to use only one of the two contact diffusions 7 and 7', or the two diffusions may be combined—for example to form an annular diffusion surrounding the electrode 9. As the voltage between the electrode 9 and the diffusions 7 and 7' is increased, at a certain point a conducting n-type channel will be formed underneath the electrode 9 (this is true at 0 V for depletion-type transistors) and the electrode 9 constitutes a capacitance in conjunction with the conducting channel.

In accordance with the invention, a region 10 of a conductivity type opposite to the conductivity type of the region 5 is provided, which region 10 is constituted by the nondiffused portion of the layer 4 adjacent the region 5. In said region 10, two p+ type contact diffusions 6 and 6' are provided. On the region 5, the insulating layer 8 is provided with holes through which contact can be made with the diffusions 6 and 6' and an electrode 9' is arranged on the insulating layer. The region 10 with the diffusions 6 and 6' and with the electrode 9' constitutes a p-channel field-effect transistor $T_2$.

The diffusions 6 and 6' are coupled to terminal 1 and electrodes 9 and 9' are connected to terminal 2. At a sufficiently negative voltage of electrode 9' relative to the diffusions 6 and 6'—already at 0 V when a depletion-type transistor is employed—a conductive p-type channel is formed underneath the electrode 9', which in conjunction with the electrode 9' constitutes a capacitance. A similar situation exists for a postive gate voltage on electrode 9. Thus, the capacitance underneath the electrode 9 is operative for signals on point 2 which are positive relative to point 1 and the capacitance underneath the electrode 9' is operative for negative signals.

In order to obtain a smooth transition from the capacitance underneath the one insulated electrode (9) to the capacitance underneath the other insulated electrode (9') when enhancement-type transistors are employed, a bias-voltage souce 11 may be included between the diffusions 6 and 6' and the diffusions 7 and 7'.

Figure 2:
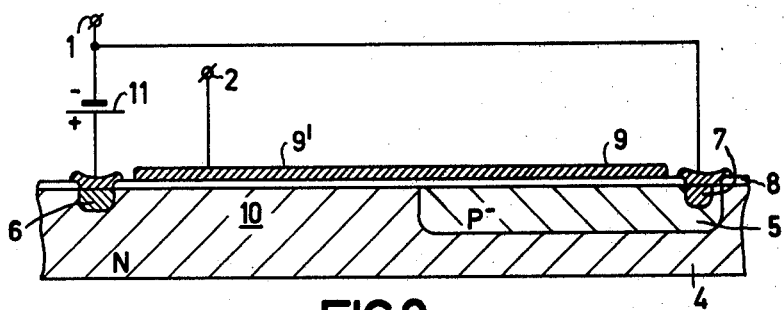
FIG. 2 represents a slightly modified form of the field-effect capacitance of FIG. 1.

FIG. 2 represents a variant of the embodiment of FIG. 1 in which the diffusions 6' and 7' are dispensed with and the electrodes 9 and 9' are combined. This results in a larger effective area and thus a higher capacitance value.

Figure 3:
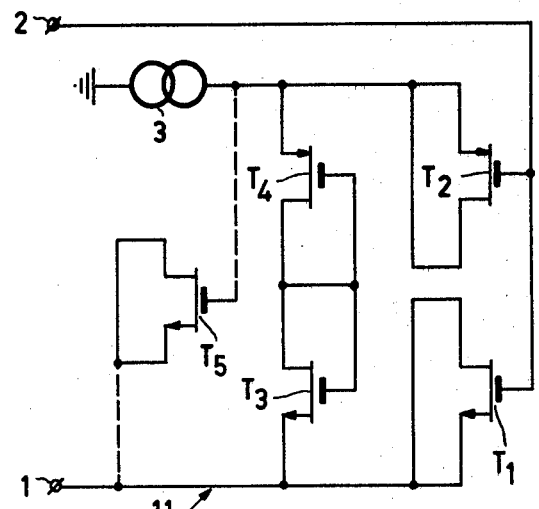
FIG. 3 represents the circuit diagram of a preferred embodiment of the field-effect capacitance in accordance with the invention.

FIG. 3 is the electrical diagram of the field-effect capacitance in accordance with the invention, the capacitance formed underneath the electrodes 9 and 9' being represented by the n-channel field-effect transistor $T_1$ and the p-channel field-effect transistor $T_2$ respectively, each with interconnected source and drain electrodes. Between the source electrodes of the transistors $T_2$ and $T_1$ the bias-voltage source 11 is constituted by the series connection of a p-channel field-effect transistor $T_4$ and an n-channel field-effect transistor $T_3$, each with interconnected gate and drain electrodes, which series connection is turned on by the current source 3 (transistors $T_3$ and $T_4$ may be interchanged). When these transistors $T_3$ and $T_4$ are just driven into conduction, the source 11 will carry a voltage which corresponds to the sum of the voltages necessary to form a conductive channel underneath the electrodes 9 and 9'. Thus, the channels of transistors $T_1$ and $T_2$ are in a balanced situation. For a signal voltage of the one polarity the channel in transistor $T_1$ disappears and transistor $T_2$ functions as a capacitance, and for a signal voltage of the other polarity between points 1 and 2 the channel in transistor $T_2$ disappears and transistor $T_1$ functions as a capacitance.

When transistors $T_1$ and $T_2$ are of the depletion type, the source 11 may be replaced by a short-circuit. In some cases this is also possible when transistors $T_1$ and $T_2$ are of the enhancement type, for example, when the voltage waveform between terminals 1 and 2 is irrelevant, such as in the case of current drive. The range where neither of the transistors $T_1$ and $T_2$ then constitutes a capacitance is then passed through very rapidly, because a current which is applied to a capacitance equal to zero (or a very small value in practice), causes a voltage rise which, depending on the polarity of the drive current, renders one of the two transistors $T_1$ and $T_2$ operative as a capacitance.

In order to short-circuit the signal-current resistance of the bias-voltage source 11, a field-effect capacitance constituted by an n-channel transistor $T_5$ may be included in parallel with the source 11. Said transistor $T_5$ is always correctly biased by the source 11. It is alternatively possible to employ a p-channel transistor $T_5$ as short-circuting capacitance. Its gate electrode should then be connected to terminal 1 and its drain electrode to the source electrode of transistor $T_2$.

What is claimed is:

1. A field-effect capacitance comprising a first region of a first conductivity type in a semiconductor layer, which first region is provided with at least one contact electrode which is connected to a first terminal, and which region is provided with an insulated electrode having a first electrode portion on said first region, said first electrode portion being connected to a second terminal, characterized in that in said semiconductor layer there is provided a second semiconductor region of a second conductivity type opposite to that of the first conductivity type, which second region is provided with at least one contact electrode which is coupled to the first terminal and with a second portion of said insulated electrode arranged on said second region, the second portion of said insulated electrode being connected to the second terminal.

2. A field-effect capacitance as claimed in claim 1, the semiconductor properties of said capacitance being such that at a voltage of zero volts between the contact electrode and the insulated electrode portions of said first and second regions no conductive layer is formed which extends completely underneath the insulated electrode, characterized in that between the contact electrode of the first region and the contact electrode of the second region there is included a bias-voltage source, which bias-voltage source has such a value that underneath one of said portions of the insulated electrode there is always a conductive layer which extends completely underneath said one portion.

3. A field-effect capacitance as claimed in claim 2, characterized in that said bias-voltage source comprises a series connection of a first and a second insulated-gate field-effect transistor, the drain electrodes of said first and second transistors being connected together and to the gate electrodes of said first and second transistors, and the source electrodes of said first and second transistors being connected to the contact electrodes of the first and second regions, respectively.

4. A field-effect capacitance as claimed in claim 3, characterized in that there is provided a current souce for applying quiescent current to the first and the second transistor connected between the source of said second transistor and ground.

5. A field-effect capacitance as claimed in claim 2, 3 or 4, characterized in that the bias-voltage source is shunted by a field-effect capacitance.

6. A field-effect capacitance as claimed in claim 1, 2, 3 or 4, characterized in that the first and the second regions adjoin each other and that the insulated electrode portions arranged on said regions also adjoin each other.

* * * * *